United States Patent [19]

Gaskill, Jr. et al.

[11] 3,925,691

[45] Dec. 9, 1975

[54] CASCODE NODE IDLE CURRENT INJECTION MEANS

[75] Inventors: James R. Gaskill, Jr., Pacific Palisades; Don C. Devendorf, Los Angeles, both of Calif.

[73] Assignee: Hughes Aircraft Company, Culver City, Calif.

[22] Filed: Mar. 11, 1974

[21] Appl. No.: 450,018

[52] U.S. Cl. ................. 307/300; 307/254; 307/215

[51] Int. Cl.$^{2}$........................................... A03K 17/00

[58] Field of Search ........... 307/202, 215, 300, 254; 330/300

[56] References Cited

UNITED STATES PATENTS

| | | | |
|---|---|---|---|
| 3,241,078 | 3/1966 | Jones | 330/30 D |
| 3,549,900 | 12/1970 | Yu | 307/215 |
| 3,550,040 | 12/1970 | Sinusas | 330/30 D |
| 3,660,679 | 5/1972 | Ighigaki et al. | 330/30 D |

*Primary Examiner*—Stanley D. Miller, Jr.
*Assistant Examiner*—B. P. Davis
*Attorney, Agent, or Firm*—W. H. MacAllister, Jr.; F. I. Konzem

[57] ABSTRACT

Large valued resistors or current source transistors are used in an Emitter-Coupled Logic (ECL) cascode current switch circuit to cause the injection of an idle current in each of the upper current switch transistors of said circuit. The injection of the idle current through these transistors causes them to operate at all times in an active region. When the transistors remain in the active operating region and are subjected to a switching transient, the delay required to charge or discharge the emitter-base junction depletion layer capacitances and for minority profile "buildup" in the base region of said transistors is reduced. Consequently, the cascode current switch's propagation delay is reduced; and spurious output signals are reduced.

2 Claims, 2 Drawing Figures

CASCODE NODE IDLE CURRENT INJECTION MEANS

BACKGROUND OF THE INVENTION

1. Field of the Invention

This invention relates to the injection of idle current into a cascode current switch and, more particularly, the use of large valued resistors or current source transistors to cause the injection of the idle current in the cascode current switch.

2. Description of the Prior Art

In the prior art, Emitter-Coupled Logic (ECL) cascode circuits have been used as current switches. But, one of the problems with these switches is their delay in switching relative to conventional current switch emitter follower circuits and the glytches in the output signals. The present invention though nearly eliminates these glytches and speeds up the switching time of said circuits by injecting idle current into the transistors of said circuits.

SUMMARY OF THE INVENTION

In an ECL cascode current switch comprising a lower current switch comprising a pair of transistors, a pair of upper current switches (having two transistors each), large valued resistors or current source transistors are used to inject idle current at the cascode nodes common to the emitters of said upper current switch transistors. Since one of the transistors in each switch is held "on" by the injection of idle current, the delay required to charge and discharge their emitter base junction capacitances and for minority profile "buildup" in these transistors is reduced, thereby reducing the overall cascode current switch's propagation delay time and spurious output signals.

Accordingly, it is an object of this invention to provide idle current injection into a cascode current switch at the cascode nodes by the use of large valued resistors or current source transistors.

Another object of the present invention is to reduce the delay in the switching of a current switch and to reduce spurious output signals in said switch by the use of idle current injection.

Other objects and advantages of this invention will become apparent from the following portion of the specification, the claims, and the attached drawings.

DETAILED DESCRIPTION

Figure 1:
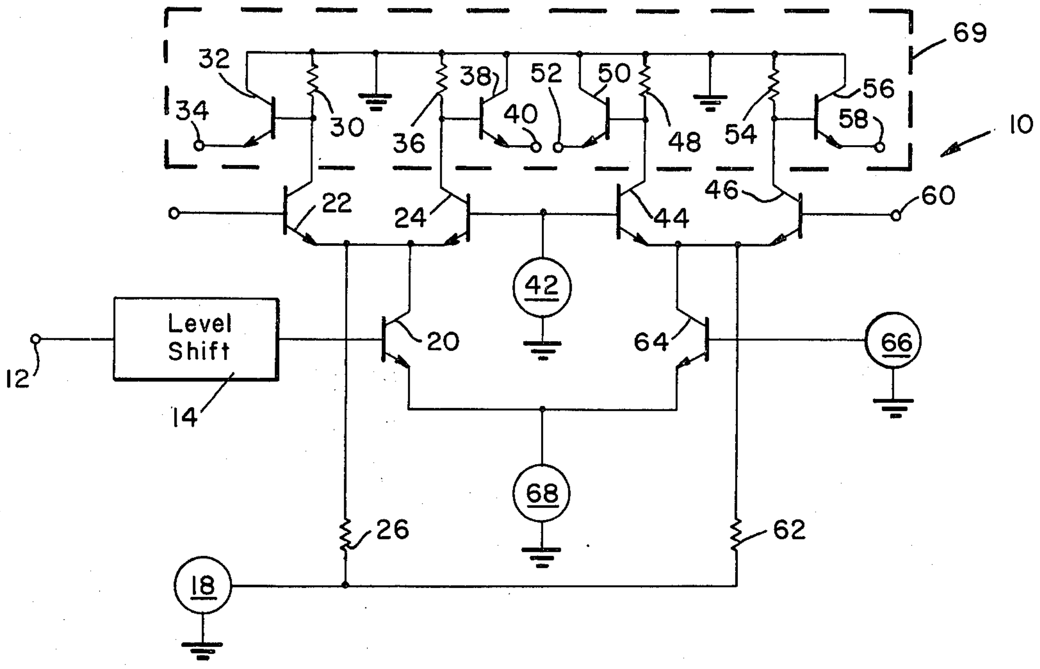
FIG. 1 is a schematic of the first embodiment of the present invention, an ECL cascode current switch which incorporates resistors to inject idle current into the upper current switch transistors of said current switch.

Referring to FIG. 1 of the drawings, which is the first embodiment of the present invention, the ECL cascode circuit 10 consists of a lower current switch consisting of transistors 20 and 64 and two pairs of upper current switches consisting of transistors 22, 24 and transistors 44 and 46. In many ECL circuits, the single transistors (22 and 46) connected to the inputs (28 and 60) in FIG. 1, are replaced by multiple transistors to provide for example, a plurality of inputs to the circuit. This variation doesn't effect the invention or the principles of the invention at hand however, and therefore to simplify descriptions below, single transistors are assumed. The ECL cascode circuit 10 also contains a signal input 12, two bias inputs 42 and 66 which may be for example −1.3 volts and −2.9 volts respectively, two inputs 28 and 60, two idle current sources, resistors 26 and 62, and a switch current source 68. Signal input 12 which receives either a logical "1" which may be approximately −0.9 volts or a logical "0" which may be approximately −1.7 volts is connected to level shift 14 which may consist of an NPN transistor and a diode, the emitter of said transistor being connected to the anode of said diode, that anode being connected to the base of transistor 20 and also to a source of "pull-down-current" such as a resistor connected to a negative supply voltage. Alternatively any other of a number of well known level shift circuits providing for example a −1.6 volts drop between the input 12 and the base of transistor 20 may be used. It is also noted that multiple emitter follower transistors may be incorporated in the level shift circuitry (possibly to provide multiple lower current switch circuit logical inputs) or that multiple transistors (each with its own level shift input circuit) may be used instead of the single transistor 20. To simplify descriptions presented below however, it is assumed that only a single lower current switch input and a single transistor 20, are incorporated in the circuit. The principles and implementation of the invention remain the same regardless of whether or not such multiple input features are incorporated.

The collector of transistor 20 is connected at the first cascode node, node 1 to both the emitters of transistors 22 and 24, which form the first upper current switch and to resistor 26, which is connected to $V_{EE}$, or any other appropriate negative source of voltage 18. The base of transistor 24 is connected to bias input voltage 42 which is also supplied to the base of transistor 44. The base of transistor 22 is connected to input 28, and the emitter of transistor 22 is connected to the emitter of transistor 24. Transistors 44 and 46 form the second upper current switch. The emitter of transistor 44 is connected to the emitter of transistor 46, at the second cascode node, node 2 and also to the collector of transistor 64 and to resistor 62, which is connected to negative source voltage 18. The base of transistor 46 is connected to input 60. The base of transistor 64 is connected to a second bias input voltage 66. The emitter of transistor 64 is connected to the emitter of transistor 20 and to a conventional current source circuit 68.

In cascode current switch circuits a large variety of output circuit networks are used. These may entail "collector dotting" wherein for example the collectors from two or more of the upper current switch transistors such as 22 and 44 are connected together and fed to a single load resistor and emitter follower. Said output circuits may also or alternatively entail cross connection of emitter follower outputs thereby forming an "implicit-or" function. To simplify the following description however, it is assumed for purposes only of clarification that separate output subcircuits 69 are used. It is to be understood though that this simplification in no way limits or otherwise circumscribes the invention which involves improvements principally effecting those sections of the circuitry described above.

In the output circuitry the collector of transistor 22 may be connected to resistor 30 and to the base of transistor 32. The other end of resistor 30 may be connected to ground or any appropriate $V_{CC}$ supply voltage. The emitter of transistor 32 is connected to output 34. The collector of transistor 24 may be connected to resistor 36 and to the base of transistor 38. Resistor 36 connected to the base of transistor 38, is returned to ground or any appropriate $V_{CC}$ supply voltage and the emitter of transistor 38 is connected to output 40. The collector of transistor 44 is connected to resistor 48 and to the base of transistor 50. Resistor 48, connected to the base of transistor 50 is returned to ground and any appropriate $V_{CC}$ supply voltage. And the emitter of transistor 50 is connected to output 52. The collector of transistor 46 is connected to resistor 54 and to the base of transistor 56. Resistor 54 is connected to the base of transistor 56 is returned to ground or any other appropriate $V_{CC}$ supply voltage. And the emitter of transistor 56 is connected to output 58.

CIRCUIT OPERATION

In the ECL cascode circuit 10 the steering of the switch current through the tree of transistors is determined by the input signal at 12. When the input signal at 12 is a logical "1" or high level signal (e.g., −0.9 volts), the voltage at the emitter of transistor 20 will for example be at −3.3 volts since the base to emitter voltage drop across said transistor is about −0.8 volts, and the level shift circuit translates the original input by about −1.6v to the base of transistor 20. If the bias input voltage at 66 is at −2.9 volts, the base-to-emitter voltage ($V_{BE}$) drop across transistor 64 will only be −0.4 volts since the emitter of transistor 20 is holding the emitter of transistor 64 at −3.3 volts. Therefore, when a high input signal is present at 12, transistor 20 is turned on and transistor 64 is turned off since the $V_{BE}$ across transistor 64 is only −0.4 volts. Also when input 12 high is the switch current passes from the "cascode node", node 1 at the emitters of transistors 22 and 24 through transistor 20. If the input at 28 is high, the current passes through transistor 22. If the signal input at 28 is low, the current passes instead through transistor 24.

When the input signal at 12 is a logical "0" or low (e.g., −1.7 volts), the base voltage of transistor 20 is low (e.g., at −3.3 volts) transistor 64 turns on; therefore, $V_{BE}$ of transistor 64 is −0.8 volts and the voltage at the emitter of transistor 64 is −3.7 volts. This voltage in turn holds the voltage at the emitter of transistor 20 at −3.7 volts, so that $V_{BE}$ of transistor 20 is −0.4 volts (−3.7 − [−3.3]); therefore, transistor 20 is turned off. Also when the input at 12 is a low signal level, current flows through transistor 64 and if transistor 46 is turned on, through transistor 46. Otherwise it flows through transistor 44.

The effects of the idle current injection at the cascode nodes 1 and 2 in improving circuit propagation delay are next described in terms of current initially switched through transistor 64 and to flow through transistor 46, its output being "high" (eg. −0.9 volts) and constant before and after the transfer. During such a transfer, the transistor 46 "turn on time", and hence, the circuit's propagation delay, is effected, by the time during which the transistor 64 collector current charges the transistor 46 emitter base junction capacitance and the other capacitance present at node 2. This charging time depends on the initial value of the voltage at node 2. When the input at 12 is high, the switch current is fed through transistor 20; but by injecting idle current through transistor 46, it remains turned on. Consequently, when switch current is later transferred back through transistor 46, caused by the input at 12 being returned to a low input level, the $V_{BE}$ of transistor 46 increases only slightly to conduct switch current plus idle current. The delay through the circuit is, therefore, nearly constant and smaller than it would be for the same circuit without idle current injection. The delay is smaller because transistor 46 stays turned on, and the only delay is essentially the time needed to supply extra base and emitter charge to transistor 46, as its emitter current increases from idle current to idle current plus switch current. In the same circuit without idle current injection, the delay through transistor 46 includes the time to supply this extra charge plus the time to turn 46 on originally. Moreover, the time required to supply the extra base and emitter charge depends on the cascode node voltage excursion. Since the range on this excursion is kept small by the presence of idle current, variation of this charging time and, therefore, of overall circuit propagation delay remains nearly constant and is significantly reduced. The similar improvements are obtained through idle current injection at node 1.

The idle currents are produced by connecting large valued resistors 26 and 62 between the cascode nodes 1 and 2 respectively and any appropriate negative voltage supply such as 18; these idle currents will flow from said nodes at all times.

A problem in cascode circuits such as 10 in FIG. 1 is their production of spurious output signals or "glytches" following simultaneous transitions of the lower current switch input signal and one or both of the upper current switch input signals. Such glytches occur when a portion of the switch current is temporarily drawn through an upper current switch transistor causing a concomitant drop in its' associated output voltage or when switch current being drawn through an upper current switch transistor is temporarily reduced causing a concomitant rise in its associated output voltage.

Two mechanisms are responsible for these spurious glytch outputs. One mechanism is due to a longer "transfer delay" of the cascode circuit's lower current switch than the "transfer delay" of either of its upper current switches. The other mechanism is due to a charge imbalance in the emitter base junctions of the transistors of one upper current switch which develops while the switch current is being drawn through the other upper current switch.

These complex and interrelated mechanisms and the way that idle current injection acts to reduce their degrading effects are described in the following example that contrasts circuit behavior with and without idle current injection. In the example it is assumed that initially inputs 12, 28, and 60 are low and have been at their low values for are relatively long time. It is then assumed that all three inputs simultaneously undergo a negative to positive transition (e.g. from −1.7 volts to −0.9 volts).

Before considering the behavior of the circuit during and right after these transitions, it is first noted that with the inputs all low, and the circuit in a steady state condition, switch current is conducted through transistors 44 and 64 causing a drop across resistor 48 and therefore is low output 52. All other inputs are high for these input conditions. Similarly it is noted that at some time after all three input signals have undergone their transitions to the high state and the circuit has "come to rest", switch current will be conducted through transistors 20 and 22 causing a drop across resistor 30 and a low output at 34. All other outputs are to be in a high state for the (3 inputs high) input condition. Consequently it is noted that both before and after the transition, outputs 58 and 40 are to be in a high state. Moreover, they should remain in that high state during the transition as well. If these outputs should drop temporarily however during the transition, generating spurious outputs, these spurious or glytch outputs may be fed to other logic circuits being driven by the one considered, thereby possibly causing erroneous results to be computed by the digital network in which the circuit is incorporated.

Now consideration is directed toward the behavior of the circuit with idle current injection during and after the transition. Just before the transition, the voltage at the emitters of transistors 22 and 24 will be at about −2.05 volts because the idle current is being conducted through transistor 24 and its base is connected to the −1.3 volt reference source. Thus before the transition, the (base-emitter voltage) $V_{BE}$ of transistor 24 is 0.75 volts and the $V_{BE}$ of transistor 22 is about 0.35 volts. With the low input applied at 12 and the level shift circuit taken to introduce about a 1.6 volt drop, the base of transistor 20 is about −3.3 volts so that the (collector-base voltage) $V_{CB}$ of transistor 20 is about +1.25 volts. Similarly after the transition, examination of the circuit reveals that the voltage at the emitters of transistors 22 and 24 will be at about −1.7 volts while that at the base of transistor 20 will be at about −2.5 volts. Thus after the transition $V_{BE}$ of transistor 22 will be at about 0.8 volts, $V_{BE}$ of transistor 24 will be at about 0.4 volts, and $V_{CB}$ of transistor 20 will be at about 0.8 volts. Therefore, during the circuit's state transfer, a change in the transistor 22 $V_{BE}$ will be about 0.45 volts (positive) and a change in the transistor 20 $V_{CB}$ will be about 0.8 volts (negative or discharge). (It will be important to recall these incremental changes in junction voltages when the circuit's behavior without idle current is considered shortly below.)

Immediately following the input signal transitions, the lower current switch's base drive input is delayed (e.g. by about 100pS) due to lag through the level shift circuit. Consequently the transfer at the upper left differential pair (22, 24) occurs slightly in advance of the time when switch current is drawn through transistor 20. Therefore when this current begins to increase, it flows correctly as it should through transistor 22 and no spurious current flows through transistor 24. Thus output 40 remains high as it is supposed to during and after the transition. Because of the slight delay in the response of the lower current switch however, partial switching of the right hand upper current switch does occur before switch current is no longer drawn from the emitters of this pair (transistors 44 and 46). Thus a small and short duration glytch current does flow through transistor 46 and there is a small negative glytch pulse at output 58. The glytch problem is much worse when idle current injection isn't used. This situation is as follows:

In the same circuit but without idle current injection, just before the input signals undergo their low to high transition, the internal circuit conditions differ significantly from the previously considered case. Because the inputs are assumed to have been in their constant low state for some time, the voltage at the emitters of transistors 22 and 24 has "floated" up to a value about midway between the voltage at the bases of these transistors i.e. the emitter voltage is at about −1.5 volts. (Junction capacitance change distribution and small leakage currents in the circuit have caused this to occur.) Note that since its input is low, transistor 20 isn't conducting and so the node common to the transistor 22 and 24 emitters (node 1) is essentially "uncontrolled". Consequently the $V_{BE}$ of transistor 22 is at about −0.2 volts and the $V_{BE}$ of transistor 24 is at about +0.2 volts. The $V_{CB}$ of transistor 20 is at about +1.8 volts!! The values of $V_{BE}$ for transistors 22 and 24 and the value of $V_{CB}$ of transistor 20 after the transistion will be the same as they were in the circuit with idle current injection. Thus in this case during the transition, $V_{BE}$ of transistor 22 must change by a full 1 volt and $V_{CB}$ of transistor 20 must change by 1.8 volts. These changes contrast with changes of 0.45 volts and 0.8 volts for the circuit with idle current.

For the circuit without idle current, the delay through the level shift circuit remains about the same as it was in the previously considered case but the response of the lower current switch (transistors 20 and 64) is delayed relative to that in the previous case. The relative delay occurs because the collector-base junction capacitance of transistor 20 must be charged in parallel with its emitter base capacitance prior to the turn-on of transistor 20 so that it can befin to conduct the switch current. Since the incremental collector junction charge required is more than twice as much however the lower current switch's response is delayed by a time that is relatively long compared to the switching time of the upper right current switch (transistors 44 and 46). Thus a significant fraction of the switch current erroneously is caused to flow through transistor 46 thereby causing a negative glytch pulse output at 58 which is much larger than that in the same circuit with idle current injection.

The conditions at the emitter of transistors 22 and 24 also causes another glytch output. There, the relatively larger transistor 20 collector junction discharge current into this emitter junction and the fact that $V_{BE}$ of transistor 22 must change by a full volt prior to its conduction of any of the switch current drawn from the transistor 20 collector, once lower current switch transfer begins, causes this switch current to be drawn initially through transistor 24. Consequently output 40 exhibits a negative glytch output pulse also.

Although as has been noted in the above example, idle current injection doesn't completely eliminate glytch outputs, examination of the circuit's response to the various other simultaneous input transitions reveals that a significant reduction of these glytch outputs occurs when idle currents are used.

In summary, the the injection of idle current, suppresses glytch signals otherwise produced in the cascode circuit 10. This glytch reduction in addition to the primary benefit of propagation delay stabilization and minimization can be obtained by injecting idle current into the transistors of cascode circuit.

Figure 2:
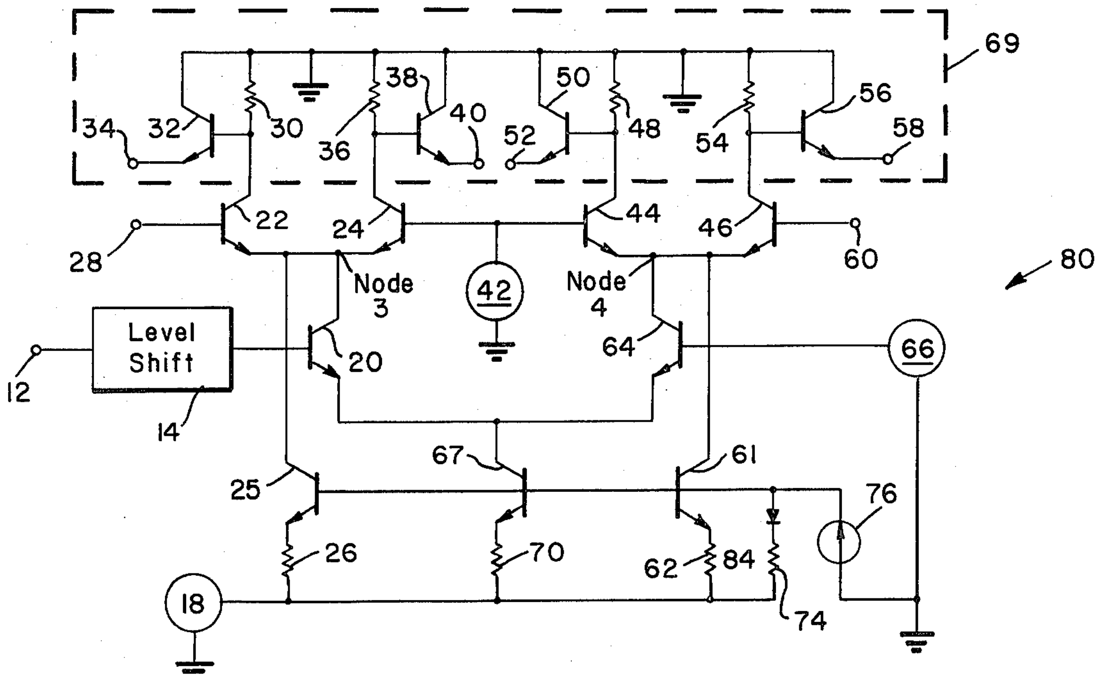
FIG. 2 is a schematic of the second embodiment of the present invention, an ECL cascode current switch uses current source transistors to inject idle current into the upper current switch transistors of said cascode current switch.

Referring now to FIG. 2 of the drawings, which is a second embodiment of the present invention, the ECL cascode circuit 80 consists of a lower differential switch comprising transistors 20 and 64 and a pair of upper differential switches comprising transistors 22, 24, and transistors 44 and 46 respectively. As noted in relation to the first embodiment, here also, the single transistors connected to the inputs (28 and 60) in FIG. 2, may be replaced by multiple transistors to provide for example, a plurality of inputs to the circuit. This variation doesn't effect the invention or the principles of the invention at hand however, and therefore to simplify descriptions below, single transistors are assumed. The ECL cascode circuit 80 also contains a signal input 12, two bias input voltages 42 and 66, two inputs 28 and 60, two idle current sources, and a switch current source. Signal input 12 which receives either a logical "1"which is approximately −0.9 volts or a logical "0"which is approximately −1.7 volts is connected to level shift 14 which may consist of an NPN transistor and a diode, the emitter of said transistor being connected to the anode of said diode, that anode being connected to the base of transistor 20 and also to a source of "pull down-current" such as a resistor connect to a negation supply voltage.' Alternatively, any other of a number of well known level shift circuits providing for example a −1.6 volt drop between the input 12 and the base of transistor 20, may be used. Again, it is also noted that (possibly to provide multiple lower current switch circuit logical inputs) multiple emitter follower transistors may be incorporated in the level shift circuitry or that multiple transistors (each with its own level shift input circuit) may be used instead of the single transistor 20. To simplify descriptions presented below however, it is assumed that only a single lower current switch input and single transistor 20, are incorporated in the circuit. The principles and implementation of the invention remain the same regardless of whether or not such multiple input features are incorporated.

The collector of transistor 20 is connected at the first cascode node, node 3 to both the emitters of transistors 22 and 24, which form the first upper current switch and to the collector of transistor 25; the emitter of transistor 25 is connected through resistor 26 to negative voltage supply 18. The base of transistor 24 is connected to bias input voltage 42 which is also supplied to the base of transistor 44. The base of transistor 22 is connected to input 28, and the emitter of transistor 22 is connected to the emitter of transistor 24. Transistors 44 and 46 form the second upper current switch. The emitter of transistor 44 is connected to the emitter of transistor 46, at the second cascode node, node 4 and also to the collector of transistor 64 and to the collector of transistor 61, the emitter of transistor 61 is connected through resistor 62 to negative voltage source 18, $V_{EE}$. The base of transistor 46 is connected to input 60. The base of transistor 64 is connected to a second bias input voltage 66. The emitter of transistor 64 is connected to the emitter of transistor 20 and to a conventional current source circuit consisting of transistor 67 and resistor 70 connected to negative voltage supply 18.

As in cascode current switch circuit 10, a large variety of output circuit networks are used. These may entail "collector dotting" wherein for example the collectors from two or more of the upper current switch transistors such as 22 and 44 are connected together and fed to a single load resistor and emitter follower. Said output circuits may also or alternatively entail cross connection of emitter follower outputs thereby forming an "implicit-or" function. To simplify the following description however, it is assumed for purposes only of clarification that separate output subcircuits 69 are used. It is to be understood though that this simplification in no way limits or otherwise circumscribes the invention which involves improvements principally effecting those sections of the circuitry described above.

In the output circuitry the collector of transistor 22 may be connected to resistor 30 and to the base of transistor 32. Resistor 30 may be connected to the base of transistor 32 is returned to ground or any appropriate $V_{CC}$ supply voltage. The emitter of transistor 32 may be connected to output 34. The collector of transistor 24 may be connected to resistor 36 and to the base of transistor 38. Resistor 36, connected to the base of transistor 38 is returned to ground or any appropriate $V_{CC}$ supply voltage and the emitter of transistor 38 is connected to output 40. The collector of transistor 44 is connected to resistor 48 and to the base of transistor 50. Resistor 48, connected to the base of transistor 50 is returned to ground or any appropriate $V_{CC}$ supply voltage. And the emitter of transistor 50 is connected to output 52. The collector of transistor 46 is connected to resistor 54 and to the base of transistor 56. Resistor 54, connected to the base of transistor 56 is returned to ground or any other appropriate $V_{CC}$ supply voltage. And the emitter of transistor 56 is connected to output 58.

The base of transistor 67 is connected to the base of transistor 25, the base of transistor 61, the anode of diode 72 and to current source 76. The cathode of diode 72 is connected through resistor 74 to negative voltage source 18. In this second embodiment, the first idle current drawn from node 3 is produced by current source transistor 25 and resistor 26; the second idle current is produced by transistor 61 and resistor 62. The ratio of the switch current to the idle currents (taken here to be identical in value), is determined approximately by the radio of (identical) resistors 26 and 62 to resistor 70. The switch current is set by the ratio of resistor 70 to resistor 74 and the value of the pilot source current, 76. In this regard, diode 72 is matched in integrated circuits to the emitter base diodes of transistors 25, 67, and 61. Thus, to a first approximation, the $V_{BE}$ drops across transistors 25, 67, 61, and diode 72 may be treated as equal and nearly constant, independent of the currents conducted by them, if said currents are roughly of the same order of magnitude. Consequently since the voltages at the base of transistors 25, 67, and 61 and at the anode of diode 72 are identical in all cases, if the $V_{BE}$ drops are taken as everywhere constant, then the voltages at the emitters of transistor 25, 67, and 61 and at the cathode of diode 72 will be about the same. Then since resistors 26, 70, 72, and 64 are all connected at their lower ends to $V_{EE}$, the voltage drops across all of said resistors will also be nearly the same in all cases. Consequently, the currents in each of the sources is set by adjusting the ratios of resistors 26, 70, and 62 to resistor 74 through which in the latter case the pilot current is constrained to pass. (The base currents in transistors 25, 67, and 64, may be neglected to a first order approximation). The ratio of idle current to switch current is between 1:10 to 1:50.

As with cascode circuit 10, of FIG. 1, by injecting idle current at cascode nodes 3 and 4 of circuit 80, the circuit's propagation delay time is greatly improved, and glytch signals at outputs 34 and 58 are suppressed.

Although the device which has just been described appears to afford the greater advantages for implementing the invention, it will be understood that various modifications thereto without going beyond the scope of the invention, it being possible to replace certain elements by other elements capable of fulfilling the same technical function therein. In particular in this regard, idle current injection in cascode circuits having more than two levels of series gating either by using resistors as transistor current sources or the two in combination is deemed within the scope of the invention.

What is claimed is:

1. In an ECL network having a lower current switching circuit and a first and second upper current switching circuit, each circuit comprising a plurality of input transistors and a reference transistor, their emitters being connected, each upper circuit having the bases of one of its input transistors connected to input signals, the bases of the other two reference transistors of said upper circuits being connected to each other and to a bias voltage source, the emitters of said first upper circuit being connected to the collector of said first transistor of said lower circuit and the emitters of said second upper circuit being connected to the collector of said second transistor of said lower circuit, the base of said first transistor being connected to a plurality of level shifted input signals and the base of said second transistor of said lower circuit being connected to a bias voltage source the emitters of the lower current switching transistors being connected together and to the collector of a current source transistor, that current source transistor having its emitter connected through a resistor to a negative voltage source and its base to a diode reference circuit, wherein the improvement comprises:

a first and second idle current source, each comprising a resistor;

said first idle current source is connected between said emitters of said first upper circuit and any appropriate negative voltage source or constant voltage point within said circuit, for supplying idle current to said emitters in order to keep said transistors of said first upper circuit partially conducting at all times to reduce said network's switching time;

said second idle current source is connected between said emitters of said second upper circuit and said negative voltage source for supplying idle current to said emitters in order to keep said transistors of said second upper circuit partially conducting at all times to reduce said network's switching time;

a switch current source comprising a transistor and a resistor, which is connected between said emitters of said lower circuit and said negative voltage source.

2. In an ECL network having a lower current switching circuit and a first and second upper current switching circuit, each circuit comprising a plurality of input transistors and a reference transistor, their emitters being connected, each upper circuit having the bases of one of its input transistors connected to input signals, the bases of the other two reference transistors of said upper circuits being connected to each other and to a bias voltage source, the emitters of said first upper circuit being connected to the collector of said first transistor of said lower circuit and the emitters of said second upper circuit being connected to the collector of said second transistor of said lower circuit, the base of said first transistor being connected to a plurality of level shifted input signals and the base of said second transistor of said lower circuit being connected to a bias voltage source, the emitters of the lower current switching transistors being connected together and to the collector of a current source transistor, that current source transistor having its emitter connected through a resistor to a negative voltage source and its base to a diode reference circuit, wherein the improvement comprises:

a first and second idle current source, each comprising a transistor and a resistor;

said first idle current source is connected between said emitters of said first upper circuit and any appropriate negative voltage source or constant voltage point within said circuit, for supplying idle current to said emitters in order to keep said transistors of said first upper circuit partially conducting at all times to reduce said network's switching time;

said second idle current source is connected between said emitters of said second upper circuit and said negative voltage source for supplying idle current to said emitters in order to keep said transistors of said second upper circuit partially conducting at all times to reduce said network's switching time.

* * * * *